United States Patent [19]

Goto et al.

[11] 4,182,958

[45] Jan. 8, 1980

[54] METHOD AND APPARATUS FOR PROJECTING A BEAM OF ELECTRICALLY CHARGED PARTICLES

[75] Inventors: Eiichi Goto, Fujisawa; Masanori Idesawa, Wako; Tateaki Sasaki, Tokyo; Takashi Soma, Kiyose, all of Japan

[73] Assignee: Rikagaku Kenkyusho, Wake, Japan

[21] Appl. No.: 909,217

[22] Filed: May 25, 1978

[30] Foreign Application Priority Data

May 31, 1977 [JP] Japan ............................... 52-63873
Jun. 25, 1977 [JP] Japan ............................... 52-75760

[51] Int. Cl.² ............................................. A61K 27/02
[52] U.S. Cl. ................................. 250/492 A; 250/398
[58] Field of Search ................ 250/492 R, 492 A, 398

[56] References Cited

U.S. PATENT DOCUMENTS

| 3,326,176 | 6/1976 | Sibley | 118/6 |
| 3,491,236 | 1/1970 | Newberry | 250/492 |
| 3,876,883 | 4/1975 | Broers et al. | 250/492 A |
| 4,117,340 | 9/1978 | Goto et al. | 250/492 A |

Primary Examiner—Harold A. Dixon
Attorney, Agent, or Firm—Bucknam and Archer

[57] ABSTRACT

Disclosed is an improvement of method and apparatus for varying the cross-section of a beam of electrically charged particles and projecting the so-varied beam onto the target. Passing through a plurality of apertured masks one after another, a beam of electrically charged particles is so deflected that the image of the overlapping area of the apertures of the masks appears on a target. According to this invention a beam of charged particles is deflected between two subsequent masks upstream so as to reduce the amount of beam current to that which is required in forming a desired image on the target, and the so-reduced beam is deflected between two subsequent masks downstream so as to trim and shape the cross-section of the beam into the exact and sharp contour as desired.

The method and apparatus for varying and projecting a beam of electrically charged particles according to this invention are particularly useful in producing microcircuits.

5 Claims, 11 Drawing Figures

FIG. 7
FIG. 8
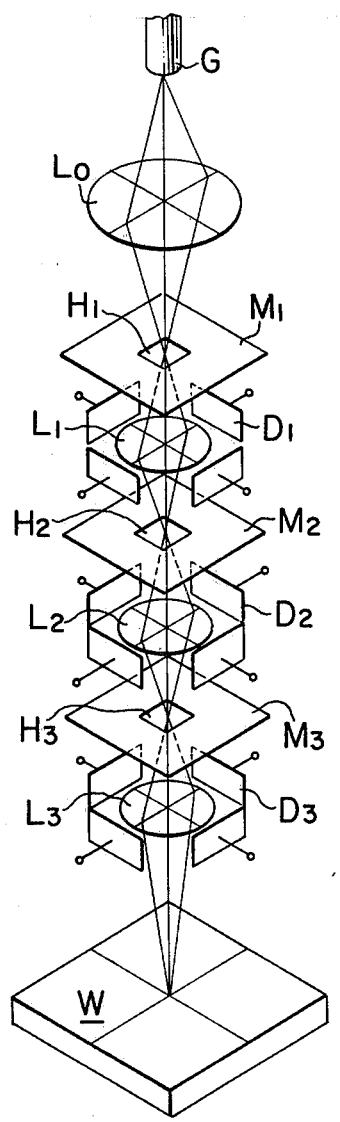
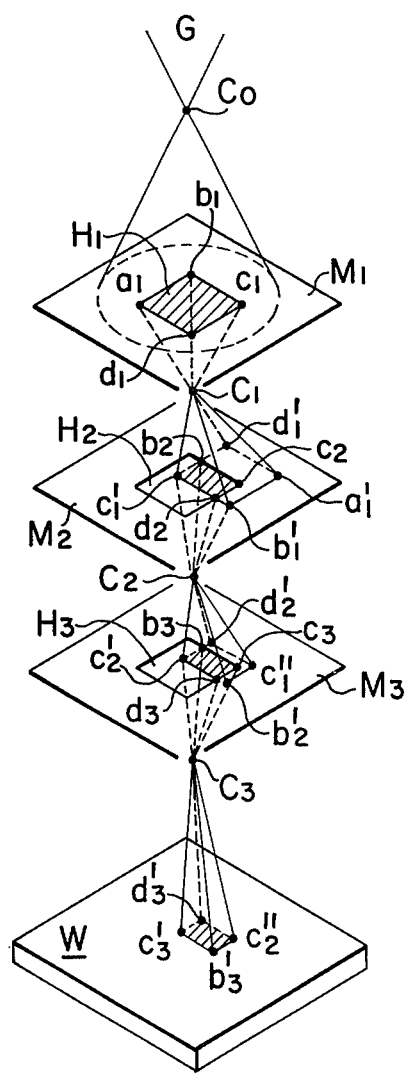

METHOD AND APPARATUS FOR PROJECTING A BEAM OF ELECTRICALLY CHARGED PARTICLES

BACKGROUND OF THE INVENTION

This invention relates to an improvement of method and apparatus for varying the cross-section of the beam of electrically charged particles and projecting the so-varied beam of electrically charged particles onto a target, which method and apparatus is particularly useful in making semiconductor devices, integrated circuits and other microscopic machinework. Electron beam exposure apparatuses have been used in producing a variety of semiconductor devices and master masks, and there has been an ever increasing demand for raising the exposure speed in the hope of improving the productivity. Such a demand, however, cannot be satisfied with recourse to the electron beam sweeping-and-projecting method according to which a beam spot of very small and definite diameter sweeps and blots one part after another on a target. In the hope of meeting such a demand there has been recently proposed an electron beam varying-and-projecting method according to which the cross-section of the electron beam is varied both in size and shape, and the so-varied electron beam is allowed to pass to a target.

Referring to FIG. 1, the principle of the electron beam varying-and-projecting method is described. As shown in the drawing, an electron beam projecting apparatus uses two apertured masks $M_1$ and $M_2$ each having a rectangular or square aperture $H_1$ or $H_2$, and two deflecting means $D_1$ and $D_2$ capable of deflecting the electron beam transverse to the beam path in all directions, thus causing the cross-section of the electron beam to vary both in shape and size before reaching a selected part of the target W.

In operation, the first apertured mask $M_1$ is illuminated with the electron beam. After the electron beam passes through the square aperture $H_1$ of the first mask $M_1$ and through the lens $L_1$, it is deflected by the deflecting means $D_1$ with respect to the square aperture $H_2$ of the second apertured mask $M_2$. Thus, the clear image of the square aperture $H_1$ of the first mask $M_1$ appears on the second apertured mask $M_2$ in the overlapping relation with the aperture $H_2$ of the second mask $M_2$. After the electron beam passes through the second mask $M_2$ and through the second lens $L_2$, it is deflected by the deflecting means $D_2$ so that the electron beam whose cross-section corresponds to the overlapping area of the apertures $H_1$ and $H_2$ of the first and second masks $M_1$ and $M_2$ strikes against a selected part of the target W.

As is readily understood, by controlling the transverse deflections of the beam at two different positions a variety of electron beams as shown in FIG. 2A (shaped area) result. In producing for instance semiconductor devices, a variety of patches are projected onto a semiconductor substrate one after another to form a desired pattern thereon in the form of patchwork. Apparently the electron beam varying-and-projecting method is most effective to reduce the exposure time involved for forming a given pattern on the target, requiring a short exposure time compared with blotting with the electron beam spot, and accordingly raising the productivity of semiconductor devices.

The electron beam varying-and-projecting method is satisfactory for almost all purposes. This method, when using an increased beam current, however, is difficult to use in microscopic machinework requiring resolution as high as 0.1 micrometers. Because the polygonal image of the overlapping area of the first and second apertures appearing on the target is not clear at those sides which are defined and are in contour with corresponding sides of the first aperture $M_1$. The inventors found that the blurring of the image on the target is mainly caused by the Coulomb's repulsion between electrons or space charge effect while travelling from the first apertured mask to the target, as is later described in detail. Also, the inventors found that the thermal deformation of the second aperture $M_2$ appreciably contributes to the distortion of the image of the overlapping space of the first and second apertures. The thermal deformation is caused by selectively preventing a large part of the electron beam from passing through the second aperture and by allowing such a large part of the electron beam to dissipate in the second apertured mask. For these reasons the precision of the final image of the overlapping space of the first and second apertures is lowered. Still disadvantageously, the heating of the second mask shortens the effective life of the second mask.

The object of this invention is to provide an improvement of the electron beam varying-and-projecting method and apparatus which is free from the defects above mentioned, thus assuring that a clear and precise image of the overlapping space of the apertures of the masks is formed on the target, still retaining an increased exposure rate. The image sharpness or resolution attained by this invention makes the electron beam varying-and-projecting art increasingly useful in microscopic machine-work as required in producing minute semiconductor devices. To attain the object of this invention a method of varying-and-projecting a beam of electrically charged particles comprising the steps of: providing at least three apertured masks; illuminating the aperture of the uppermost mask with the beam; deflecting the beam between some of the masks upstream so as to reduce the beam to the amount which is required in forming a desired image on a target; and deflecting the so-reduced beam between masks downstream so as to trim the cross-section of the beam into the exact shape of the desired image.

In another aspect of the method of varying-and-projecting a beam of charged particles according to this invention the beam is deflected between some apertured masks upstream so as to allow the beam to have a marginal portion to the exact shape of the desired image, and the so-modified beam is deflected between the apertured masks downstream so as to remove the marginal portion from the beam.

An apparatus for varying-and-projecting a beam of electrically charged particles according to this invention comprises: a gun for supplying the beam; at least three apertured masks; deflectors and lens means; and means for supplying electric signals of two kinds to said deflectors, deflectors associated with some of the apertured masks upstream being responsive to the electric signal of one kind for reducing the beam to the amount which is required in forming a desired image on a target, whereas deflectors associated with the apertured masks downstream being responsive to the electric signal of the other kind for trimming the beam into the exact shape of the desired image. In another aspect of the apparatus for varying-and-projecting a beam of electrically charged particles according to this invention some of said deflectors and associated lens means are arranged coextensive with each other.

BRIEF DESCRIPTION OF THE DRAWINGS

FIG. 7 is a perspective view of a beam varying-and-projecting apparatus according to this invention.

FIG. 8 shows the manner in which the beam patch is formed by the apparatus as shown in FIG. 7.

DETAILED DESCRIPTION OF THE ILLUSTRATED EMBODIMENTS

Figure 1:
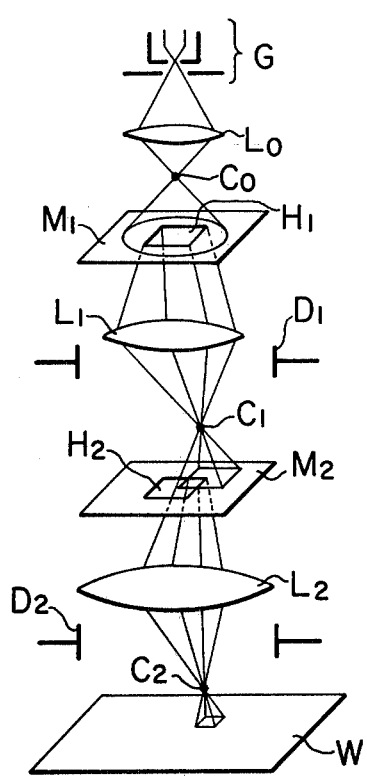
FIG. 1 is a perspective view of the conventional electron beam varying-and-projecting system.
Figure 3A:
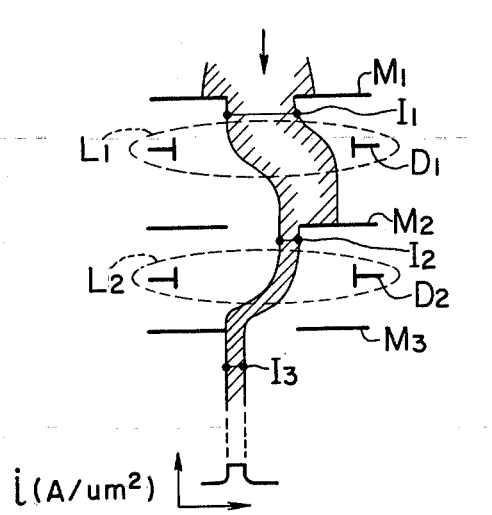
FIG. 3a shows diagrammatically the principle of the invention according to which the blurring is reduced to minimum.

Referring to FIGS. 1 and 3a, the principle of this invention is described hereinafter.

As a matter of fact, those of the sides of the final image which are defined by and are in contour with corresponding sides of the aperture of the first mask appear blurring on the target, whereas the rest sides of the final image which are defined by and are in contour with corresponding sides of the aperture of the second mask appear relatively clear on the target. The inventors found that the blurring is mainly caused by the Coulomb's repulsion effect within the flow of electrons running from the first apertured mask to the target. As shown in FIG. 1, after passing through the first aperture $H_1$ of the first mask $M_1$ and through the second aperture $H_2$ of the second mask $M_2$, the electron beam reaches the target W. On the way from the first mask to the target the repulsive coulomb force acts on electrons within the flow of the beam. Macroscopically viewed, the electrons in the circumferential annular area of the cross-section of the beam are repulsed from the electrons in the inner circular area of the cross-section of the beam, thus causing the cross-section of the beam to expand outwardly. The flaring of the beam increases with the amount of beam current and with the length of the beam path, and the blurring of the final image accordingly grows to the extent that the precision of the image shape lowers below that which is required in producing microcircuits and other minute units. At the crossover points $C_1$ and $C_2$ the electron beam is at a large current density, and the space charge effect accordingly increases, contributing the resultant blur so much.

Figure 3B:
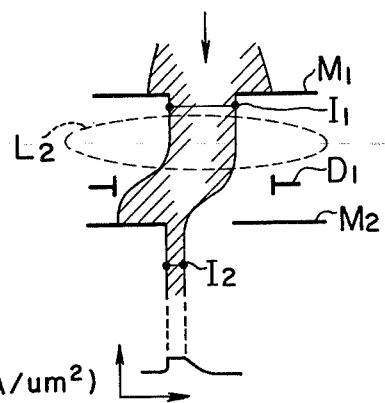
FIG. 3b shows diagrammatically how the blurring is caused in the conventional beam varying-and-projecting system.

Referring to FIG. 3a, the principle of this invention is described hereinafter. FIG. 3a shows diagramatically an electron beam varying-and-projecting system using three apertured masks, and the manner in which the electron beam is deflected according to this invention. For the purpose of comparison FIG. 3b shows diagramatically a conventional electron beam varying-and-projecting system using two apertured masks and the manner in which the electron beam is deflected to vary the beam and project the so-varied beam onto a target. In either case the image of the overlapping area of the apertures of the two apertured masks $M_2$ and $M_3$ in FIG. 3a or $M_1$ and $M_2$ in FIG. 3b appears on the target. Thank to the use of one extra apertured mask the heavy beam current $I_1$ is reduced at an early stage to the amount which is required in forming a desired patch on the target, thus substantially reducing the space charge effect on the flaring of electron beam. In FIG. 3a the beam of heavy current $I_1$ is so deflected that the second apertured mask $M_2$ prevents the undesired part (or amount) of the beam from passing therethrough, still allowing the desired part of the beam plus an extra marginal part to pass therethrough. The desired part of the beam is the one which is required in forming the final image of the overlapping space of the apertures of the masks $M_2$ and $M_3$, and the extra margine is the one which is added to the left side of the final image. The beam of small current $I_2$ is so deflected that the mask $M_3$ removes the extra margine from the beam of small current, thus allowing only the desired part of the beam in the form of the overlapping area of the mask apertures to reach the target. Thus, the flaring side (left) of the electron beam $I_1$ and $I_2$ is trimmed before flowing from the lowermost apertured mask $M_3$. The electron beam $I_2$ appreciably flares at the right side while travelling from the intermediate apertured mask $M_2$ to the lowermost apertured mask $M_3$. Likewise, the electron beam $I_3$ appreciably flares while travelling from the lowermost apertured mask $M_3$ to the target. These flaring can be reduced by minimizing the distance between the intermediate and lowermost apertured masks $M_2$ and $M_3$ and the distance from the lowermost apertured mask $M_3$ to the target W.

In FIG. 3b the electron beam of heavy current $I_1$ travels from the apertured mask $M_1$ to the apertured mask $M_2$. As a result the electron beam flares wide in the space between these masks $M_1$ and $M_2$, and the right side of the electron beam is not trimmed before flowing from the apertured mask $M_2$. Thus, the image of the overlapping area of the apertures of the masks $M_1$ and $M_2$ appears blurring at right side, which is defined by and in contour with corresponding sides of the aperture of the first mask. The blurring due to the space charge effect is given in terms of spatial distribution of current density $i(A/\mu m^2)$ at the lower part of each of FIGS. 3(a) and 3(b). The principle of minimizing the blurring according to this invention resides in: reducing the electron beam current to the amount as required at an early stage; adding an extra margine to the side of the so-reduced electron beam at which side the flare of the beam cannot be trimmed before reaching the lowermost apertured mask; and removing the extra margine from the electron beam when passing through the lowermost apertured mask.

Figure 4:
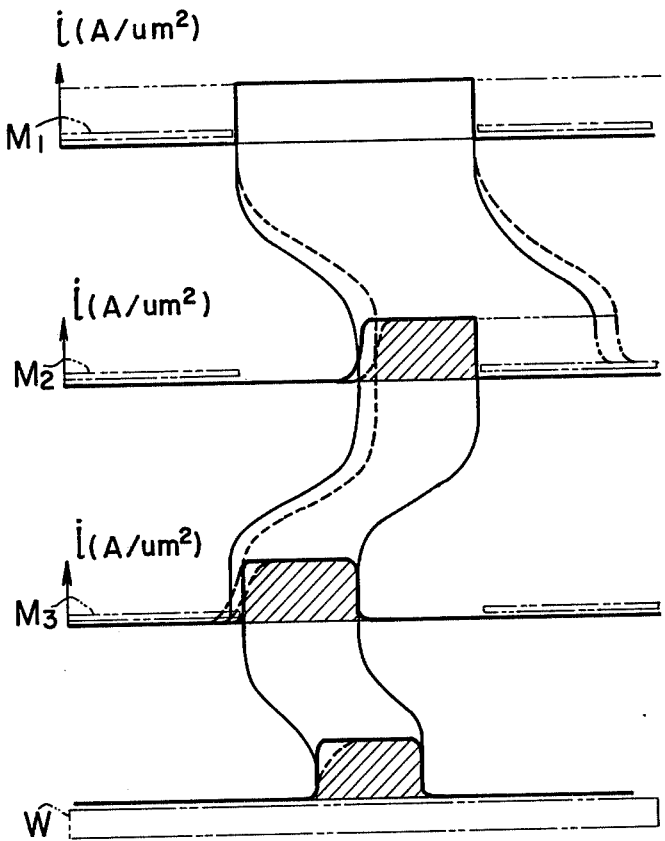
FIG. 4 shows diagrammatically how the flaring side of the beam is trimmed according to this invention.

Referring to FIG. 4, the flaring of the beam at each different stage is given in terms of the spatial distribution of current density $i(A/\mu m^2)$. In the drawing the flaring of the beam having a marginal portion is shown by solid line, whereas the flaring of the beam having no marginal portion is shown by broken line. As is apparent from the drawing, if the beam is shifted at the second apertured mask $M_2$ as indicated by broken line, the flare (left side of the beam) which is caused by the space charge effect within the beam of heavy current is partly removed at the third apertured mask $M_3$ when passing therethrough (See left and lower part of the shaded trapezoid representing the spatial distribution of current density), and the image on the target W appears blurring (See left and upper rounded corner of the shaded trapezoid). In contrast to this, if the beam is shifted at the second apertured mask $M_2$ as indicated by solid line, the flare (left side of the beam) which is caused by the space charge effect within the beam of heavy current is completely removed by the third apertured mask $M_3$, thus causing the clear image to appear on the target W.

Assuming that two apertured masks each having a 25 $\mu m \times 25$ $\mu m$ square aperture are used to provide a $1\mu m \times 25$ $\mu m$ rectangular electron beam, and that the current density of the electron beam is $i(A/\mu m^2)$, the beam currents and the blurrings in FIGS. 3a and 3b can be estimated respectively as follows: in FIG. 3b the beam current $I_1(A)$ in the intermediate space between the masks $M_1$ and $M_2$ is as large as $i \times 25 \times 25$ (A). This figure is twenty-five times as large as the amount as required, and the blurring will be accordingly multiplied. In FIG. 3a the electron beam is reduced upstream to the amount which is somewhat larger than the amount as required, as for instance $(1 \times 0.25)$ $\mu m \times 25$ $\mu m$. Thus, the amount of beam current which contributes to the blurring will be reduced twenty times. As a result the blurring will be reduced twenty times, compared with the blurring in FIG. 3b.

With a view to still reducing the blurring according to this invention the length of the beam projecting system is reduced by putting beam deflecting units $D_1$ and $D_2$ in electron lens units $L_1$ and $L_2$ respectively (broken line in FIG. 3a).

This invention is described above as applying to an electron beam varying-and-projecting system using three apertured masks, but it can be equally applied to an electron beam varying-and-projecting system using four or more apertured masks.

The inventors theoretically determined the blurring "$\delta R_i$" due to the space charge effect in an electron beam varying-and-projecting system using three or more apertured masks as follows:

$$\delta_{\tau i} = \sum_{j=i}^{n} K_j \frac{I_j \cdot Z_j}{V^{3/2}}$$

, where "$\delta R_i$" is the blurring of the "i"th aperture image on the target; "$I_j$" is the beam current flowing from the "j"th aperture to the "j+1"th aperture for $j \leq n-1$ (or the beam current flowing from the "n"th aperture to the target for j=n); "$Z_j$" is the distance from the "j"th aperture to the "j+1"th aperture for $j \leq n-1$ (or the distance from the "n"th aperture to the target for j=n); "V" is acceleration voltage and "$K_j$" is a constant pertaining to each different stage of the system. The inventors confirmed that this theoretical expression meets well the experimental results, thus proving hereby that the main cause for blurring is the coulomb repulsion or space charge effect. From the above equation the blurring pertaining to those apertured masks which are used to vary the cross-section of the beam into a desired shape can be determined. For instance, in the electron beam varying-and-projecting system using three apertured masks the last mask but one and the last or lowermost mask are used to determine the cross-section of the beam, and the blurring pertaining to the last aperture but one is proportional to the beam current flowing from the last aperture but one to the lowermost aperture, and is proportional to the length of the beam projecting system (extending from the uppermost mask to the target). In this connection the blurring can be reduced by: (1) reducing the beam current flowing from the last aperture but one to the last or lowermost aperture; (2) shortening the length of the beam projecting system; and (3) raising the acceleration voltage. In case where this invention is applied to the production of semiconductor devices, the acceleration voltage cannot be raised to the extent that the blurring is substantially reduced without destroying the semiconductor substrate. In this connection this invention reduces the blurring due to the space charge effect with recourse to items (1) and (2) above. Specifically, an electron beam varying-and-projecting system having at least three apertured masks is used, and with a view to reducing the beam current according to item (1) the electron beam while passing through some of the apertured masks upstream is deflected so as to provide an electron beam whose cross-section is similar to and somewhat larger than the final image appearing on the target. With a view to reducing the length of the projecting system according to item (2) electron lenses are put coextensive with beam deflectors.

Figure 5:
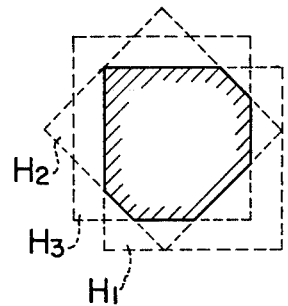
FIG. 5 is a similar view to FIG. 2, but showing a relatively complicated shape which is formed by using four or more square-apertured masks.

If use is made of four or more square-apertured masks, the polygonal shape will have an increased number of sides as shown in FIG. 5.

As shown in FIG. 3a the left side of the image patch is trimmed at the final stage, and therefore it is well defined, compared with the right side of the image patch. In this connection the well-defined (or last trimmed) side of each image patch is put along the contour of the pattern to be formed in the form of patchwork, and the inner area bounded by the contour thus determined is blotted by flood-projecting the electron beam. Thus, the well-defined pattern results.

Figure 6:
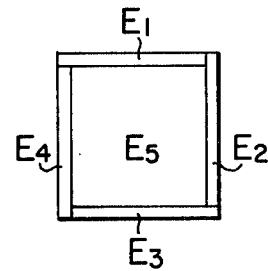
FIG. 6 shows the manner in which a relatively large pattern is formed according to this invention.
Figure 2:
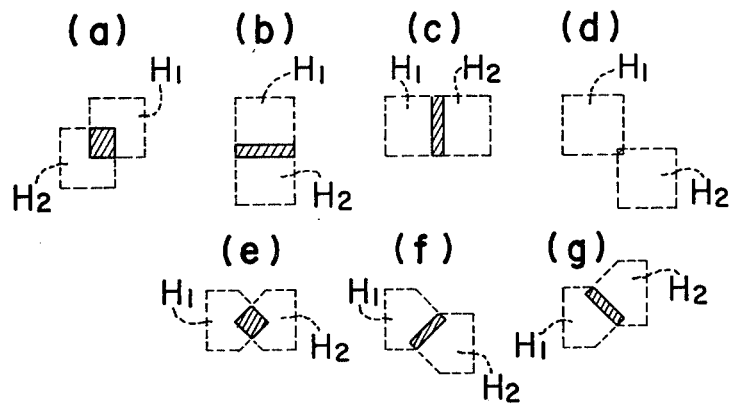
FIG. 2 shows a variety of beam patches each corresponding to the overlapping space of two different apertures.

In FIG. 6 there is shown a relatively large pattern which is formed by putting a plurality of elongated patches $E_1$, $E_2$, $E_3$ and $E_4$ on the contour of the square pattern and by flood-projecting the electron beam as large as $E_5$ to the inner area of the square pattern. Thus, a relatively large pattern can be formed at an increased rate without allowing the contour of the image to blur on the target.

As mentioned earlier, an apertured mask which is used to selectively prevent a large part of the electron beam from passing therethrough in shaping the cross-section of the beam is subjected to thermal deformation, and as a result the precision of the final image on the target of the overlapping part of the apertures of the mask and the subsequent one or ones will be accordingly lowered. According to this invention an extra apertured mask is arranged just above an apertured mask which is used to shape the cross-section of the beam, and the extra apertured mask functions as a shield preventing the thermal deformation of the underlying apertured mask.

Referring to FIGS. 7 and 8, there are shown some details of one embodiment using three square-apertured masks according to this invention. The square aperture $H_1$ of the first mask $M_1$ is illuminated with an electron beam, which flows from a gun G and passes through an electron lens $L_0$. The square beam flowing from the first mask $M_1$ passes through an electron lens $L_1$ to cause the image of the square aperture of the first mask to appear on the second square-apertured mask $M_2$ at a place which is selectively determined under the influence of the beam deflecting means $D_1$. As shown in FIG. 8, the image ($a'_1$, $b'_1$, $c'_1$ and $d'_1$) of the first square aperture ($a_1$, $b_1$, $c_1$ and $d_1$) is put on the second mask $M_2$ at such a position that the second square aperture $H_2$ allows the passing of the part of the beam which corresponds to the final rectangular image ($a'_3$, $b'_3$, $c'_3$ and $d'_3$) plus the extra margine ($d'_2$, $c''_2$, $b'_2$, $d_3$, $c_3$ and $b_3$). The rectangular beam flows from the second aperture $H_2$ and passes through the electron lens $L_2$ to the third square-apertured mask $M_3$. The rectangular beam is subjected to the influence of the beam deflecting means $D_2$, and is projected onto the third square-aperture $M_3$ at such a position that the third square aperture $H_3$ prevents the marginal part of the rectangular beam from passing therethrough, thus allowing the passage to the target of the remaining part of the beam exactly corresponding to the desired shape of the patch image on the target W. As is readily understood by those skilled in the art, the electron beam flowing from the lowermost apertured mask may be reduced and rotated or deflected before reaching the target, thus putting the patch image on the substrate so as to constitute a part of patchwork pattern as desired.

Figure 9:
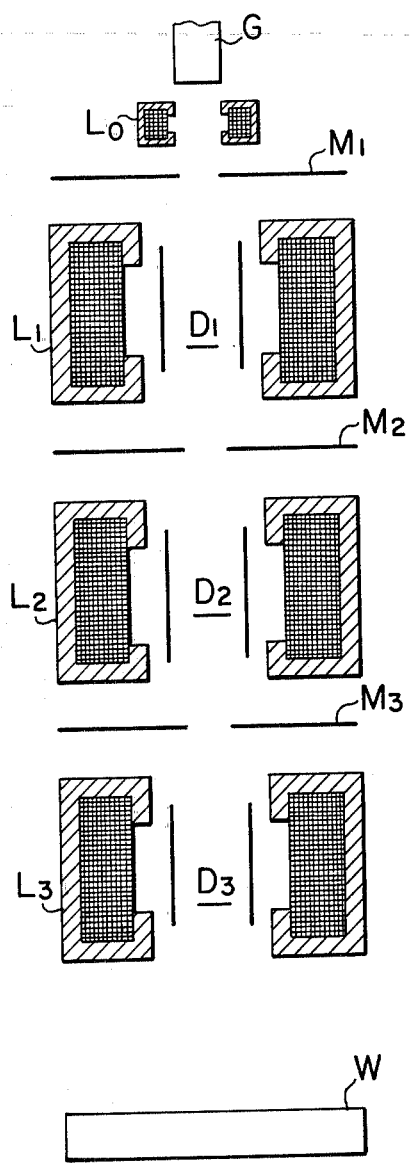
FIG. 9 shows a longitudinal section of the embodiment according to this invention.
Figure 10:
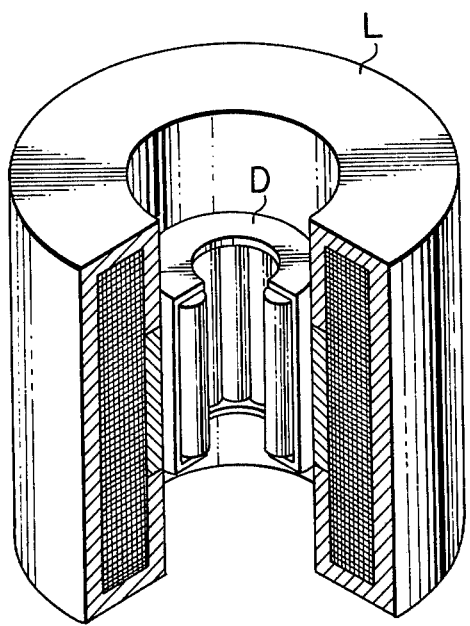
FIG. 10 is a perspective view of a deflector-and-electron lens assemblage, partly broken.

Referring to FIG. 9, there is diagrammatically shown a longitudinal section of one embodiment using three apertured masks according to this invention. As shown in FIG. 10, electromagnetic lens $L_1$, $L_2$ or $L_3$ is snugly rested in associated beam deflector $D_1$, $D_2$ or $D_3$ respectively. The assembling of electrostatic lens and beam deflector is effective to reduce the length of the beam projecting system. Advantageously, multipole (8 or 12 pole) electrostatic deflectors may be used. Because they are easy for centering with respect to the longitudinal axis. Also, they can be made in small size. This invention has been described as using an electron beam. However, it should be understood that a beam of ionized particles can be equally used, and therefore the claims describe this invention as using a beam of electrically charged particles. The shape of the mask aperture is described as square or rectangular, but this may be in any other shape, as for instance semi-circular, and regular or irregular polygon. Some magnetic lenses for rotating the beam on the way to the target may be provided in the beam projecting system.

An electrostatic and electromagnetic lens assembly may be used in place of the lens $L_3$. A current signal representing the degree of rotation by which the final image is to be rotated and projected on the target, is applied to the electromagnetic lens part, so that the focal length of the electrostatic and electromagnetic lens assembly is kept at a given constant.

What is claimed is:

1. An apparatus for varying-and-projecting a beam of electrically charged particles comprising: a gun for supplying the beam; at least three apertured masks; deflectors and lens means; and mean for supplying electric signals of two kinds to said deflectors, deflectors associated with some of the apertured masks upstream being responsive to the electric signal of one kind for reducing the beam to the amount which is required in forming the exact shape of a desired image plus a marginal portion on a target, whereas deflectors associated with the apertured masks downstream being responsive to the electric signal of the other kind for trimming the beam into the exact shape of the desired image.

2. An apparatus for varying-and-projecting a beam of electrically charged particles according to claim 1 wherein some of said deflectors and lens means are arranged coextensive with each other.

3. An apparatus for varying-and-projecting a beam of electrically charged particles according to claim 1 which it further comprises means for rotating the beam on the way to the target.

4. A method of varying-and-projecting a beam of electrically charged particles comprising the steps of: providing at least three apertured masks; illuminating the aperture of the uppermost mask with a beam having a cross-section larger than the aperture of the uppermost mask; deflecting the beam between the uppermost mask and subsequent one or ones upstream so that part of the beam is so intercepted as to allow the passage therethrough of the remaining part having a marginal portion to a desired image on a target; and deflecting the so-reduced beam between said subsequent one upstream and subsequent one or ones downstream so that the marginal portion is removed, thus preventing the blurring of the final image of the overlapping area of the apertures of associated apertured masks.

5. An apparatus for varying-and-projecting a beam of electrically charged particles according to claim 4 wherein one or ones of said apertured masks are shelter masks each preventing the thermal deformation of the underlying apertured mask.

* * * * *